United States Patent
Ooshima et al.

(10) Patent No.: US 7,432,964 B2
(45) Date of Patent: Oct. 7, 2008

(54) SOLID-STATE IMAGING DEVICE WITH PLURAL CDS CIRCUITS PER COLUMN SHARING A CAPACITOR AND/OR CLAMPING TRANSISTOR

(75) Inventors: Atsushi Ooshima, Kanagawa (JP); Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 725 days.

(21) Appl. No.: 10/914,352

(22) Filed: Aug. 9, 2004

(65) Prior Publication Data

US 2005/0040318 A1    Feb. 24, 2005

(30) Foreign Application Priority Data

Aug. 19, 2003   (JP)   ............... 2003-294938

(51) Int. Cl.
H04N 5/217    (2006.01)
H04N 3/14    (2006.01)
H04N 5/335    (2006.01)

(52) U.S. Cl. .................... 348/241; 348/302; 348/308

(58) Field of Classification Search ............ 348/241, 348/302–310
See application file for complete search history.

(56) References Cited

U.S. PATENT DOCUMENTS 5,274,459 A * 12/1993 Hamasaki ................ 348/249
5,335,008 A * 8/1994 Hamasaki ................ 348/301
6,067,113 A * 5/2000 Hurwitz et al. ............ 348/241

FOREIGN PATENT DOCUMENTS

| JP | 11-298911 | 10/1999 |
|----|-----------|---------|
| JP | 2000-078474 | 3/2000 |
| JP | 2003-032551 | 1/2003 |
| JP | 2003-087665 | 3/2003 |

* cited by examiner

Primary Examiner—Lin Ye
Assistant Examiner—Daniel M Pasiewicz
(74) Attorney, Agent, or Firm—Robert J. Depke; Rockey, Depke & Lyons, LLC

(57) ABSTRACT

A solid-state imaging device includes a pixel array area having pixels including photoelectric transducers arranged as an array; signal lines wired for every pixel column in the pixel array area; and a plurality of noise reducers provided for the corresponding signal lines. Each of the noise reducers includes a first capacitor, one end of which is connected to the signal line; a first switch element, an input port of which is connected to the other end of the first capacitor; a second capacitor connected between an output port of the first switch element and a reference voltage; and a clamping element for clamping the voltage of a connecting node between the output port of the first switch element and the second capacitor to a predetermined voltage. The first capacitor is shared among the plurality of noise reducers.

11 Claims, 6 Drawing Sheets

SOLID-STATE IMAGING DEVICE WITH PLURAL CDS CIRCUITS PER COLUMN SHARING A CAPACITOR AND/OR CLAMPING TRANSISTOR

BACKGROUND OF THE INVENTION

1. Field of the Invention

The present invention relates to a solid-state imaging device.

2. Description of the Related Art

Solid-state imaging devices, for example, X-Y addressing solid-state imaging devices typified by complementary metal-oxide semiconductor (CMOS) image sensors, each adopt a structure having noise reduction means, for example, a correlated double sampling (CDS) circuit provided for every pixel column in a pixel array area in order to reduce a fixed pattern noise due to variations in the threshold voltage of transistors in each pixel. The CDS circuit sequentially receives a reset level and a signal level output from each pixel in a selected pixel column in the pixel array area and reduces the fixed pattern noise for every pixel by determining the difference between the reset level and the signal level.

FIG. 7 is a circuit diagram showing a configuration example of a CDS circuit. Referring to FIG. 7, the CDS circuit has a structure having two capacitors 101 and 102, a sampling transistor 103, and a clamp transistor 104. One CDS circuit is provided for every vertical signal line 105 through which a signal of each pixel is transmitted. The vertical signal line 105 is wired for every vertical pixel column of a pixel array area 100 in which pixels are two-dimensionally arranged. In this example, N-channel metal oxide semiconductor (MOS) transistors are used as the sampling transistor 103 and the clamp transistor 104.

One end of the capacitor 101 is connected to the vertical signal line 105. The drain of the sampling transistor 103 is connected to the other end of the capacitor 101. A sampling pulse φSP is applied to the gate of the sampling transistor 103 through a control line 106. One end of the capacitor 102 is connected to the source of the sampling transistor 103 and the other end thereof is grounded. The source of the clamp transistor 104 is connected to the source of the sampling transistor 103. A predetermined clamp voltage Vclp is applied to the drain of the clamp transistor 104 and a clamp pulse φCLP is applied to the gate thereof through a control line 107. A connecting node among the source of the sampling transistor 103, one end of the capacitor 102, and the source of the clamp transistor 104 is hereinafter referred to as a node N.

The CDS circuit having the configuration described above has one horizontal selection transistor 108. The drain of the horizontal selection transistor 108 is connected to the node N and the source thereof is connected to a horizontal signal line 109. Horizontal selection pulses φH, which are sequentially output from a horizontal scanning circuit 110 in synchronization with horizontal scanning, are applied to the gate of the horizontal selection transistor 108. Applying a horizontal scanning pulse φH to the gate of the horizontal selection transistor 108 turns on the horizontal selection transistor 108 so as to output the voltage at the node N to the horizontal signal line 109.

The circuit operation of the CDS circuit having the configuration described above will now be described. First, with a pixel being reset, the sampling transistor 103 and the clamp transistor 104 are turned on and the horizontal selection transistor 108 is turned off to charge the capacitors 101 and 102 based on a reset voltage Vrst of the pixel output through the vertical signal line 105. Electric charges Q1 and Q2 that are calculated according to the following equations are stored in the capacitors 101 and 102:

$$Q1 = C1\,(Vrst - Vclp)$$
$$Q2 = C2 \times Vclp \qquad \text{[Formula 1]}$$

where C1 and C1 represent the capacitances of the capacitors 101 and 102, respectively.

After the clamp transistor 104 is turned off, a signal charge is read out from a photoelectric transducer in the pixel. A signal voltage Vsig of the pixel is output through the vertical signal line 105 to vary a voltage Vout at the node N according to the following equation:

$$Vout = Vclp + C1\,(Vsig - Vrst)/(C1 + C2) \qquad \text{[Formula 2]}$$

Accordingly, even if the transistors of the pixel vary in threshold value, a fixed pattern noise can be reduced based on (Vsig−Vrst).

It is assumed that one CDS circuit is provided for every vertical signal line 105 in the above description. In contrast, solid-state imaging devices each having a structure in which multiple, for example, two CDS circuits are provided for every vertical signal line 105 have been proposed in recent years in order to expand the dynamic range of optical detection (for example, Japanese Unexamined Patent Application Publication No. 2003-87665). With a structure in which multiple CDS circuits are provided for every vertical signal line 105, it is possible to increase the frame rate by, for example, reading out the signals of pixels in multiple pixel rows during one horizontal blanking period and outputting in parallel the readout signals of the pixels in the multiple pixel rows.

However, the provision of multiple CDS circuits for every vertical signal line 105 increases the area occupied by a circuit area around a pixel array area including the CDS circuits. Accordingly, the semiconductor chip (semiconductor substrate) on which the pixel array area and the peripheral circuits are integrated is increased in size and applications to which the solid-state imaging devices can be mounted are limited. Particularly, in order to improve the effect of noise reduction, the capacitors 101 and 102 must have large capacitances. Increasing the capacitances of the capacitors 101 and 102 increases the areas occupied by the capacitors 101 and 102, thus further increasing the size of the semiconductor chip.

When, for example, two CDS circuits are provided for every vertical signal line 105, the two CDS circuits cannot be arranged in the lateral direction and, therefore, they must be arranged in the vertical direction under such present circumstances because the pixel pitch has become very small along with an increase in the number of pixels in the solid-state imaging device in recent years and sufficient space cannot be allocated to the CDS circuits in the lateral direction (horizontal direction). Hence, it is necessary to slenderize the shape of the two capacitors 101 and 102 provided for every CDS circuit and to arrange the capacitors 101 and 102 in sequence along the wiring direction of the vertical signal line 105 under the restriction that the pixel pitch becomes smaller along with an increase in the number of pixels and sufficient space cannot be allocated to the CDS circuits in the lateral direction, thereby increasing the size of the semiconductor chip particularly in the vertical direction.

SUMMARY OF THE INVENTION

In order to solve the problems described above, it is an object of the present invention to provide a solid-state imaging device capable of minimizing the area occupied by multiple CDS circuits and of reducing the size of a semiconductor chip when the multiple CDS circuits are provided for every vertical signal line.

The present invention provides, in its first aspect, a solid-state imaging device including a pixel array area having pixels including photoelectric transducers arranged as an array; signal lines wired for every pixel column in the pixel array area; and a plurality of noise reducers provided for the corresponding signal lines. Each of the noise reducers includes a first capacitor, one end of which is connected to the signal line; a first switch element, an input port of which is connected to the other end of the first capacitor; a second capacitor connected between an output port of the first switch element and a reference voltage; and a clamping element for clamping the voltage of a connecting node between the output port of the first switch element and the second capacitor to a predetermined voltage. The first capacitor is shared among the plurality of noise reducers.

The present invention provides, in its second aspect, a solid-state imaging device including a pixel array area having pixels including photoelectric transducers arranged as an array; signal lines wired for every pixel column in the pixel array area; a first capacitor, one end of which is connected to the corresponding signal line; a first switch element, an input port of which is connected to the other end of the first capacitor; a second capacitor connected between an output port of the first switch element and a reference voltage; a first output element, connected to the output port of the first switch element, for outputting a signal supplied from the pixels; a second switch element, an input port of which is connected to the other end of the first capacitor; a third capacitor connected between an output port of the second switch element and the reference voltage; a second output element, connected to the output port of the second switch element, for outputting the signal supplied from the pixels; and a clamping element for clamping the voltage of a connecting node between the other end of the first capacitor and the input ports of the first and second switch elements to a predetermined voltage.

The present invention provides, in its third aspect, a solid-state imaging device including a pixel array area having pixels including photoelectric transducers arranged as an array; signal lines wired for every pixel column in the pixel array area; a first capacitor, one end of which is connected to the corresponding signal line; a first switch element, an input port of which is connected to the other end of the first capacitor; a second capacitor connected between an output port of the first switch element and a reference voltage; a first clamping element for clamping the voltage of a connecting node between the output port of the first switch element and the second capacitor to a predetermined voltage; a first output element, connected to the output port of the first switch element, for outputting a signal supplied from the pixels; a second switch element, an input port of which is connected to the other end of the first capacitor; a third capacitor connected between an output port of the second switch element and the reference voltage; a second clamping element for clamping the voltage of a connecting node between the output port of the second switch element and the third capacitor to a predetermined voltage; and a second output element, connected to the output port of the second switch element, for outputting the signal supplied from the pixels.

According to the solid-state imaging device having the configuration described above, the noise reduction means reduces noise caused by the pixels, specifically, a fixed patter noise due to variations in the threshold value of the transistors in each pixel, by determining the difference between the reset level and the signal level of the pixels sequentially supplied through the signal line. The noise reduction process is performed for the multiple-line signals output from the pixels at different timings in each of the multiple noise reduction means provided for every signal line. In other words, the noise reduction process is not performed for the multiple-line signals at the same timing in each of the multiple noise reduction means. Hence, the first capacitor can be shared among the multiple noise reduction means.

According to the present invention, sharing the first capacitor among the multiple noise reduction means to decrease the number of capacitors permits the decrease the area occupied by the noise reduction means. Accordingly, the semiconductor chip on which the peripheral circuit including the noise reduction means and the pixel array area are integrated can be reduced in size.

DESCRIPTION OF THE PREFERRED EMBODIMENTS

Embodiments of the present invention will be described in detail below with reference to the attached drawings.

Figure 1:
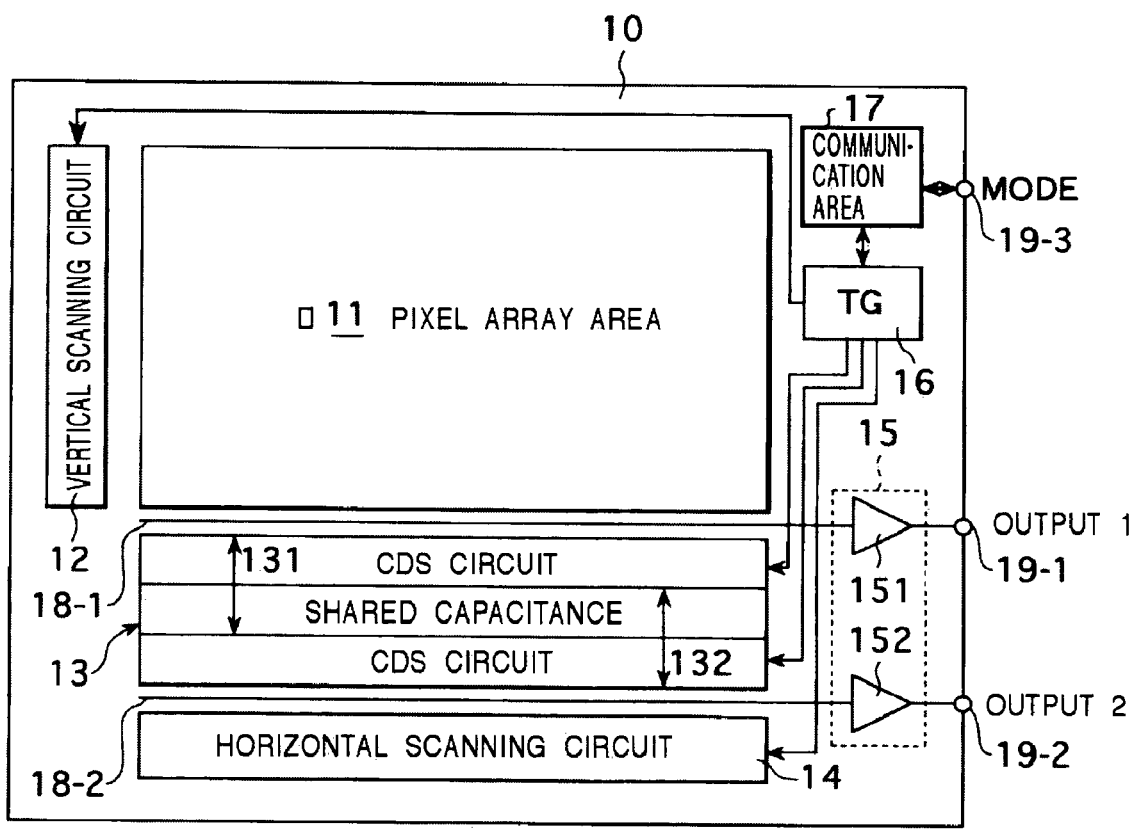
FIG. 1 is a block diagram schematically showing the structure of a solid-state imaging device according to an embodiment of the present invention.

FIG. 1 is a block diagram schematically showing the structure of a solid-state imaging device according to an embodiment of the present invention. Referring to FIG. 1, the solid-state imaging device of this embodiment has a structure in which a pixel array area 11 and a peripheral circuit including a vertical scanning circuit 12, a noise reduction circuit area 13, a horizontal scanning circuit 14, an output area 15, a timing generator (TG) 16, and a communication area 17 are integrated on a semiconductor chip (semiconductor substrate) 10. Pixels, each including a photoelectric transducer, are two-dimensionally arranged as an array in the pixel array area 11.

Figure 2:
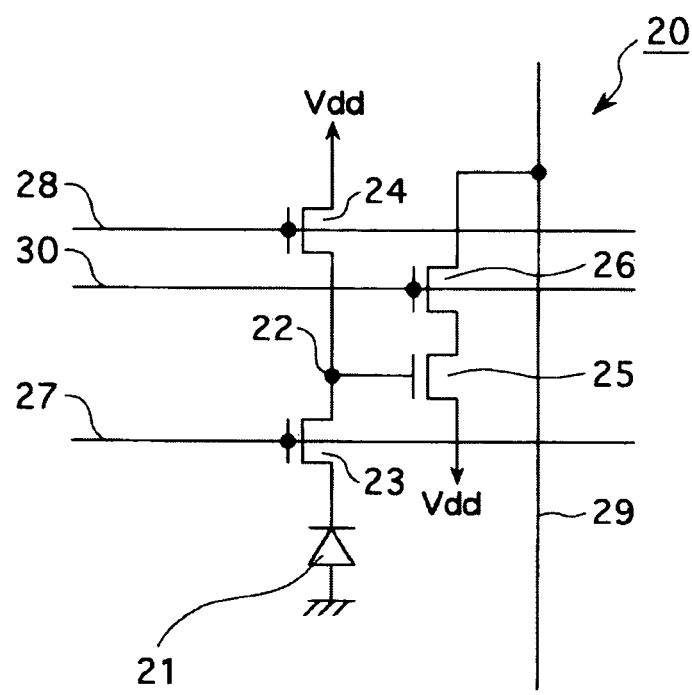
FIG. 2 is a circuit diagram showing a configuration example of a pixel in a CMOS image sensor.

FIG. 2 is a circuit diagram showing a configuration example of each pixel 20 in a CMOS image sensor, which is an example of the solid-state imaging device of this embodiment.

Referring to FIG. 2, the pixel 20 includes a photoelectric transducer, for example, a photodiode 21 for photoelectrically converting incident light and storing the converted light, a transfer transistor 23 for transferring a signal charge stored in the photodiode 21 to a floating diffusion portion (hereinafter referred to as an FD portion) 22, a reset transistor 24 for resetting the voltage of the FD portion 22 to the voltage of a positive-side power supply Vdd, an amplifying transistor 25 for amplifying the voltage of the FD portion 22, and a selection transistor 26 for selecting a pixel.

The voltage of the positive-side power supply Vdd and the voltage of a negative-side power supply (in this example, ground potential) are applied to the pixel 20. The anode of the photodiode 21 is grounded. The transfer transistor 23 is connected between the cathode of the photodiode 21 and the FD portion 22. The gate of the transfer transistor 23 is connected to a transfer control line 27. The reset transistor 24 is connected between the positive-side power supply Vdd and the FD portion 22. The gate of the reset transistor 24 is connected to a reset control line 28. The gate of the amplifying transistor 25 is connected to the FD portion 22 and the drain thereof is connected to the positive-side power supply Vdd. The selection transistor 26 is connected between the source of the amplifying transistor 25 and a vertical signal line 29. The gate of the selection transistor 26 is connected to a scanning line 30.

Although N-channel MOS transistors are used as the transfer transistor 23, the reset transistor 24, amplifying transistor 25, and the selection transistor 26 in the pixel circuit having the circuit configuration described above according to this embodiment, these transistors are not limited to the N-channel MOS transistors. P-channel MOS transistors may be used for all or part of these transistors. Alternatively, the selection transistor 26 may be omitted and the amplifying transistor 25 may function as a selection transistor.

Figure 3:
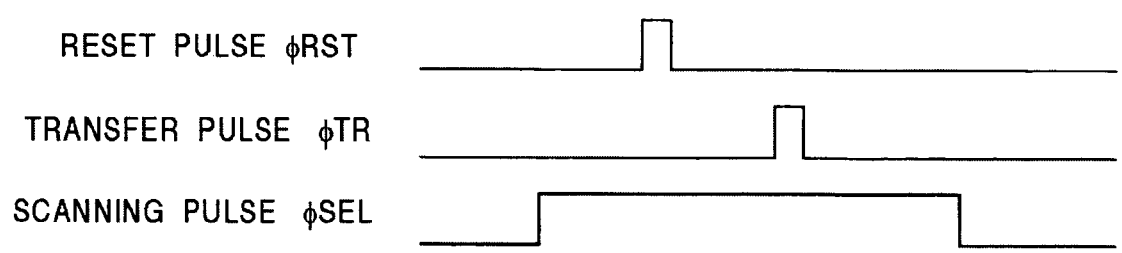
FIG. 3 is a timing chart showing an example of the timing relationship among a transfer pulse $\phi TR$, a reset pulse $\phi RST$, and a scanning pulse $\phi SEL$.

In the pixel array area 11 having the structure in which the pixels 20 are two-dimensionally arranged as an array, the vertical signal line 29 is wired for every pixel column in the pixel array area 11. The transfer control line 27, the reset control line 28, and the scanning line 30 are wired for every pixel row in the pixel array area 11. A transfer pulse φTR, a reset pulse φRST, and a scanning pulse φSEL are applied at a predetermined timing from the vertical scanning circuit 12 to each pixel 20 through these control lines including the transfer control line 27, the reset control line 28, the vertical signal line 29, and the scanning line 30. FIG. 3 is a timing chart showing an example of the timing relationship among the transfer pulse φTR, the reset pulse φRST, and the scanning pulse φSEL.

Specifically, applying the scanning pulse φSEL to each pixel 20 in a selected row turns on the selection transistor 26 of the pixel 20 in the selected row during a predetermined period and enables signals to be read from the pixel 20. Applying the reset pulse φRST to each pixel 20 in the selected row in this state turns on the reset transistor 24 and the voltage of the FD portion 22 is reset to the voltage of the positive-side power supply Vdd. A reset voltage Vrst indicating the voltage of the FD portion 22 after the reset pulse φRST is applied is supplied to the vertical signal line 29 through the amplifying transistor 25 and the selection transistor 26.

Applying the transfer pulse φTR to each pixel 20 in the selected row turns on the transfer transistor 23. The applied pulse is photoelectrically converted by the photodiodes 21 during a set exposure period, and the signal charge stored in the photodiode 21 is transferred to the FD portion 22. The voltage of the FD portion 22 is varied in accordance with the signal charge. A signal voltage Vsig indicating the voltage of the FD portion 22 after the transfer pulse φTR is applied is supplied to the vertical signal line 29 through the amplifying transistor 25 and the selection transistor 26. That is, the reset voltage Vrst is first supplied and the signal voltage Vsig is then supplied from the pixels 20 in the selected row to the vertical signal line 29.

Referring back to FIG. 1, the vertical scanning circuit 12, which is, for example, a shift register, applies the transfer pulse φTR, the reset pulse φRST, and scanning pulse φSEL to each pixel 20 in the pixel array area 11 at a predetermined timing for every selected pixel row. As a result, as described above, the reset voltage Vrst is first output and the signal voltage Vsig is then output from the pixels 20 in the selected row through the vertical signal line 29.

The reset voltage Vrst and the signal voltage Vsig are supplied to the noise reduction circuit area 13. The noise reduction circuit area 13 includes a plurality of CDS circuits, for example, two CDS circuits 131 and 132. Determining the difference between the reset voltage Vrst and the signal voltage Vsig in each of the CDS circuits 131 and 132 reduces noise caused by the pixel 20; specifically, a fixed pattern noise due to variations in the threshold voltage of the transistors in the pixel 20.

The CDS circuits 131 and 132 are arranged for every vertical signal line 29 in the pixel array area 11. Furthermore, as shown in FIG. 1, the CDS circuits 131 and 132 are arranged in this order from the pixel array area 11 side in the vertical direction in FIG. 1, that is, in the wiring direction of the vertical signal line 29 wired for every vertical pixel column in the pixel array area 11 (refer to FIG. 2). The present invention is characterized by a specific configuration of the CDS circuits 131 and 132, which will be described in detail below.

The solid-state imaging device is structured such that, for example, the two CDS circuits 131 and 132 are provided per one vertical signal line 29, for the purpose of raising a frame rate by reading out the signals of pixels in a plurality of rows during one horizontal blanking period and outputting in parallel the readout signals of the pixels in the multiple rows or for the purpose of expanding the dynamic range of optical detection by reading out the signals from the same pixel a multiple number of times (two times in this embodiment).

The horizontal scanning circuit 14, which is, for example, a shift register, sequentially outputs in synchronization with horizontal scanning horizontal scanning pulses φH that are supplied to the two CDS circuits 131 and 132. The two-line signals that are subjected to the noise reduction in the CDS circuits 131 and 132 are read out into horizontal signal lines 18-1 and 18-2 at the same timing. The two-line signals read out into the horizontal signal lines 18-1 and 18-2 are output outside the semiconductor chip 10 in parallel through two output amplifiers 151 and 152 in the output area 15 and output pins 19-1 and 19-2, respectively.

The timing generator (TG) 16 supplies various timing signals for performing various processes, such as vertical scanning in the vertical scanning circuit 12, noise reduction in the CDS circuits 131 and 132, and horizontal scanning in the horizontal scanning circuit 14, to the peripheral circuit including, for example, the vertical scanning circuit 12, the CDS circuits 131 and 132, and the horizontal scanning circuit 14. The communication area 17 controls the operation of the timing generator (TG) 16 based on a mode control signal MODE externally supplied to the semiconductor chip 10 through a control pin 19-3 to control the operation mode (drive mode) of the solid-state imaging device.

Figure 4:
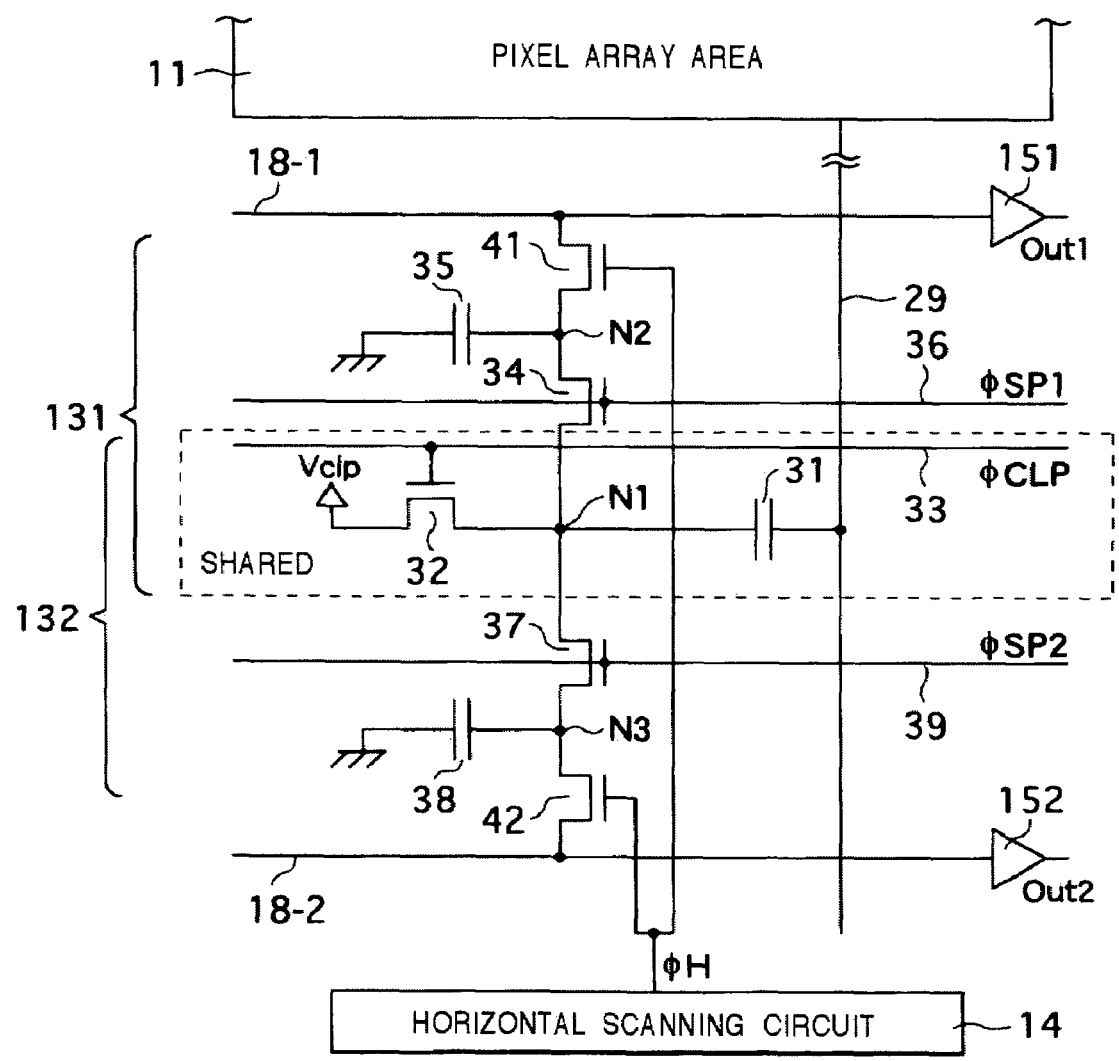
FIG. 4 is a circuit diagram showing a specific configuration of two CDS circuits.

FIG. 4 is a circuit diagram showing a specific configuration of, for example, the two CDS circuits 131 and 132 in the noise reduction circuit area 13.

Referring to FIG. 4, one end of a first capacitor 31 is connected to the vertical signal line 29. The source of a clamp transistor 32 is connected to the other end of the first capacitor 31. A clamp voltage Vclp is applied to the drain of the clamp transistor 32 and a clamp pulse φCLP is applied to the gate of the clamp transistor 32 through a control line 33. A connecting node between the other end of the first capacitor 31 and the source of the clamp transistor 32 is hereinafter referred to as a node N1. According to this embodiment, the CDS circuit 131 shares the first capacitor 31 and the clamp transistor 32 with the CDS circuit 132.

The CDS circuit 131 includes, in addition to the first capacitor 31 and the clamp transistor 32 shared with the CDS circuit 132, a sampling transistor 34, which is first switch means, and a second capacitor 35. The drain (input port) of the sampling transistor 34 is connected to the node N1. A sampling pulse φSP1 is supplied to the gate of the sampling transistor 34 through a control line 36. One end of the second capacitor 35 is connected to the source (output port) of the sampling transistor 34 and the other end thereof is grounded (reference voltage). A connecting node between the source of the sampling transistor 34 and one end of the second capacitor 35 is hereinafter referred to as a node N2.

The CDS circuit 132 includes, in addition to the first capacitor 31 and the clamp transistor 32 shared with the CDS circuit 131, a sampling transistor 37, which is second switch means, and a second capacitor 38. The drain (input port) of the sampling transistor 37 is connected to the node N1. A sampling pulse φSP2 is supplied to the gate of the sampling transistor 37 through a control line 39. One end of the second capacitor 38 is connected to the source (output port) of the sampling transistor 37 and the other end thereof is grounded. A connecting node between the source of the sampling transistor 37 and one end of the second capacitor 38 is hereinafter referred to as a node N3.

In the CDS circuits 131 and 132 having the configuration described above, the second capacitor 35 has approximately the same capacitance as the second capacitor 38. As shown in FIG. 4, the CDS circuits 131 and 132 are provided in this order from the pixel array area 11 side in the wiring direction of the vertical signal line 29, and the vertical signal line 29 is wired so as to extend into the area of the CDS circuit 132 farther from the pixel array area 11.

Although the clamp transistor 32 and the sampling transistors 34 and 37 are N-channel MOS transistors in the CDS circuits 131 and 132 of this embodiment, these transistors may be P-channel MOS transistors.

A horizontal selection transistor 41 serving as output means is connected between the node N2 of the CDS circuit 131 and the horizontal signal line 18-1. Similarly, a horizontal selection transistor 42 is connected between the node N3 of the CDS circuit 132 and the horizontal signal line 18-2. The horizontal scanning pulses φH, which are sequentially output from the horizontal scanning circuit 14 in synchronization with the horizontal scanning, are commonly supplied to the gates of the horizontal selection transistors 41 and 42.

Figure 5:
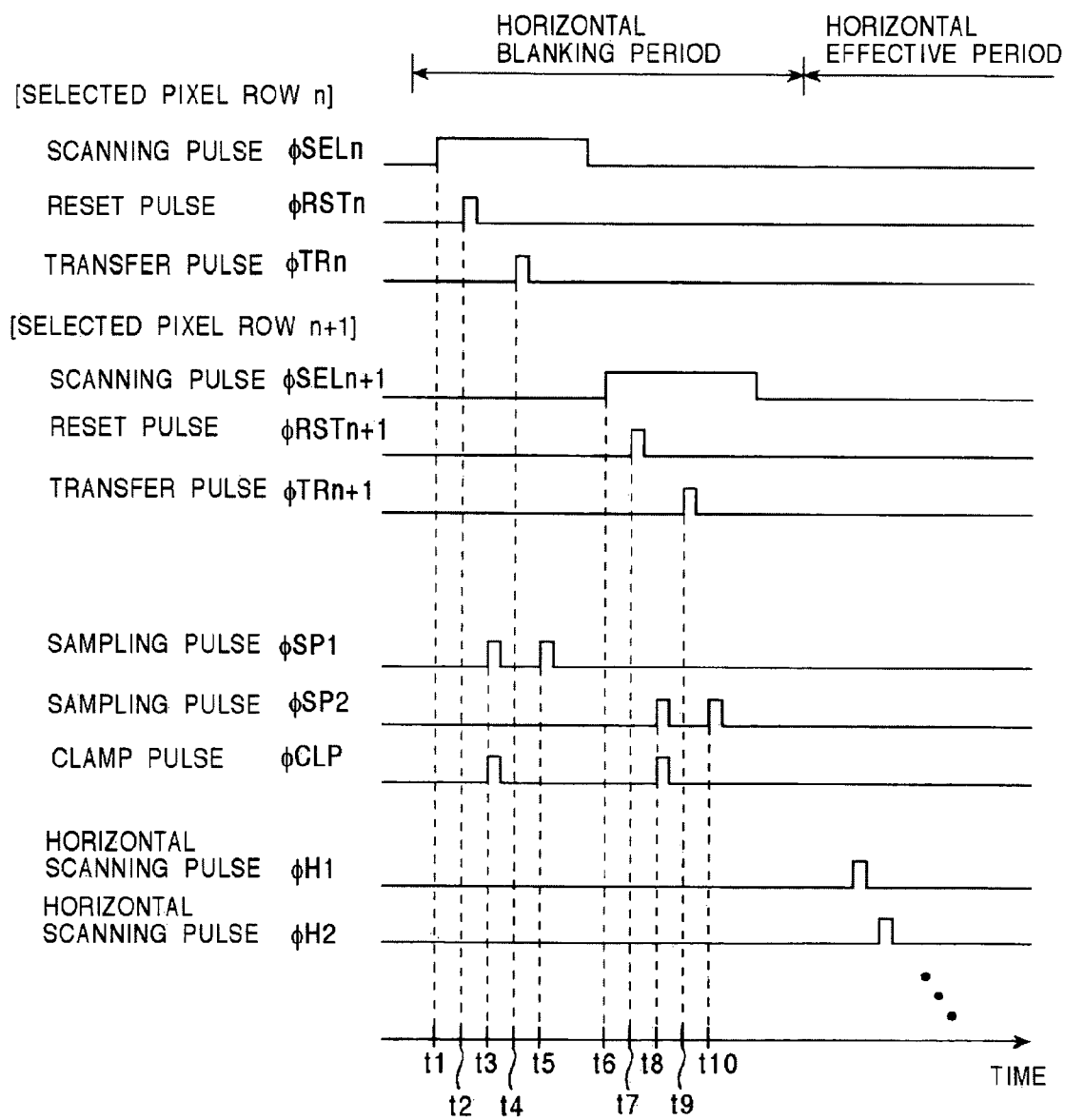
FIG. 5 is a timing chart illustrating the circuit operation of the two CDS circuits.

The circuit operation of the CDS circuits 131 and 132 having the configuration described above will now be described with reference to a timing chart shown in FIG. 5. A case in which the signals of pixels in two pixel rows are read out during one horizontal blanking period and the readout signals of the pixels in the two pixel rows are output in parallel in order to raise the frame rate will be exemplified.

At time t1, applying a scanning pulse φSELn to pixels in the n-th pixel row during one horizontal blanking period selects a pixel row n. At time t2, applying a reset pulse φRSTn to the selected pixel row n resets the FD portion 22 (refer to FIG. 2) of each pixel in the selected pixel row n. In this reset state, the voltage of the FD portion 22 is output to the vertical signal line 29 as a reset voltage Vrst1.

After the reset voltage Vrst1 is output from each pixel in the pixel row n, at time t3, a sampling pulse φSP1 and a clamp pulse φCLP are applied to the CDS circuit 131 to turn on the sampling transistor 34 and the clamp transistor 32 in the CDS circuit 131. Accordingly, the first capacitor 31 and the second capacitor 35 are charged based on the reset voltage Vrs1 of the pixel in the selected pixel row n, output through the vertical signal line 29.

Electric charges Q11 and Q12 that are calculated according to the following equations are stored in the first capacitor 31 and the second capacitor 35, respectively:

$$Q11 = C11 \, (Vrst1 - Vclp)$$

$$Q12 = C12 \times Vclp \qquad \text{[Formula 3]}$$

where C11 and C12 represent the capacitances of the first capacitor 31 and the second capacitor 35, respectively.

At time t4, applying a transfer pulse φTRn to each pixel in the selected pixel row n causes the applied pulse to be photoelectrically converted by the photodiode 21 (refer to FIG. 2) to transfer the stored signal charge to the FD portion 22. In response to the transfer of the signal charge, the voltage of the FD portion 22 is varied depending on the signal charge and is output to the vertical signal line 29 as a signal voltage Vsig1 of the pixel in the selected pixel row n.

After the signal voltage Vsig1 of each pixel in the pixel row n is output, at time t5, a sampling pulse φSP1 is applied again to the CDS circuit 131 to turn on the sampling transistor 34 in the CDS circuit 131. At this time, the clamp transistor 32 is in an off state. Applying the signal voltage Vsig1 through the vertical signal line 29 causes a voltage Vout1 at the node N2 to be varied according to the following equation:

$$Vout1 = Vclp + C11 \, (Vsig1 - Vrst1)/(C11 + C12) \qquad \text{[Formula 4]}$$

As a result, even if the transistors of the pixels in the selected pixel row n are varied in threshold voltage, a fixed pattern noise is reduced based on (Vsig1−Vrst1). The voltage Vout1 at the node N2 is maintained in the second capacitor 35 without any change.

At time t6, applying a scanning pulse φSELn+1 to pixels in the n+1-th pixel row during the same horizontal blanking period, as in the pixel row n, selects a pixel row n+1. At time t7, applying a reset pulse φRSTn+1 to the selected pixel row n+1 resets the FD portion 22 of each pixel in the selected pixel row n+1. This reset operation causes the voltage of the FD portion 22 to be output to the vertical signal line 29 as a reset voltage Vrst2.

After the reset voltage Vrst2 is output from each pixel in the pixel row n+1, at time t8, a sampling pulse φSP2 and a clamp pulse φCLP are applied to the CDS circuit 132 to turn on the sampling transistor 37 and the clamp transistor 32 in the CDS circuit 132. Accordingly, the first capacitor 31 and the second capacitor 38 are charged based on the reset voltage Vrs2 of the pixel in the selected pixel row n+1, output through the vertical signal line 29.

Electric charges Q13 and Q14 that are calculated according to the following equations are stored in the first capacitor 31 and the second capacitor 38, respectively:

$$Q13 = C11(Vrst2 - Vclp)$$

$$Q14 = C13 \times Vclp \qquad \text{[Formula 5]}$$

where C13 represents the capacitance of the second capacitor 38.

At time t9, applying a transfer pulse φTRn+1 to each pixel in the selected pixel row n+1 transfers the signal charge in the photodiode 21 to the FD portion 22. The voltage of the FD portion 22 is output to the vertical signal line 29 as a signal voltage Vsig2 of the pixel in the selected pixel row n+1. After the signal voltage Vsig2 of each pixel in the pixel row n+1 is output, at time t10, a sampling pulse φSP2 is applied again to the CDS circuit 132 to turn on the sampling transistor 37 in the CDS circuit 132. At this time, the clamp transistor 32 is in the off state.

Applying the signal voltage Vsig2 of each pixel in the selected pixel row n+1 through the vertical signal line 29 causes a voltage Vout2 at the node N3 to be varied according to the following equation:

$$Vout2=Vclp+C11\ (Vsig2-Vrst2)/(C11+C13) \quad \text{[Formula 6]}$$

As a result, even if the transistors of the pixels in the selected pixel row n+1 are varied in threshold voltage, a fixed pattern noise is reduced based on (Vsig2−Vrst2). The voltage Vout2 at the node N3 is maintained in the second capacitor 38 without any change. The capacitance C12 of the second capacitor 35 is approximately the same as the capacitance C13 of the second capacitor 38.

In the series of steps described above, the CDS process is performed for the pixels in a selected pixel column n by the CDS circuit 131 during one horizontal blanking period, and the signal voltage Vout1 of the pixels is stored in the second capacitor 35. Then, the CDS process is performed for the pixels in a selected pixel column n+1 by the CDS circuit 132, and the signal voltage Vout2 of the pixels is stored in the second capacitor 38.

In a horizontal effective period after the horizontal blanking period is completed, the horizontal scanning is performed by the horizontal scanning circuit 14 to sequentially output horizontal scanning pulses φH1, φH2, . . . from the horizontal scanning circuit 14. These horizontal scanning pulses φH1, φH2, . . . are simultaneously applied to the respective gates of the horizontal selection transistors 41 and 42, which are connected between the two CDS circuits 131 and 132 along the corresponding vertical signal line 29 and the horizontal signal lines 18-1 and 18-2, respectively. As a result, the signal voltages Vout1 and Vout2 of the pixels in the pixel columns n and n+1 stored in the second capacitors 35 and 38 are simultaneously read out into the two horizontal signal lines 18-1 and 18-2 by the horizontal selection transistors 41 and 42, and the readout voltages are output in parallel through the horizontal signal lines 18-1 and 18-2.

As described above, the first capacitor 31 for determining the difference between the signal voltage Vsig and the reset voltage Vrst and the switch means (clamp transistor 32) for clamping the voltage at the node N1 to a predetermined clamp voltage Vclp are shared between the multiple CDS circuits (the two CDS circuits 131 and 32 in this embodiment), which are arranged for every vertical signal line 29. The CDS process is performed for each of the two-line signals (the signals in the pixel columns n and n+1 in this embodiment) supplied at different timings. Accordingly, it is possible to decrease the number of capacitors by one and the number of transistors by one, thus reducing the area occupied by the CDS circuits 131 and 132 on the semiconductor chip 10.

Particularly, the number of capacitors requiring large areas can be decreased even in the configuration in which the shape of the capacitors is slenderized and the capacitors are arranged along the wiring direction of the vertical signal line 29 under the restriction that the pixel pitch becomes smaller along with an increase in the number of pixels and sufficient space cannot be allocated to the CDS circuits in the lateral direction (horizontal direction). Hence, it is possible to prevent the semiconductor chip 10 from increasing in size particularly in the vertical direction. In other words, sharing the first capacitor 31 between the CDS circuits 131 and 132 allows the vertical size of the semiconductor chip 10 to be reduced, compared with a case where the first capacitor 31 is not shared therebetween.

Although the CDS circuit 131 is arranged at the pixel array area 11 side among the two CDS circuits 131 and 132, as shown in FIG. 1, and the capacitance is shared between the two CDS circuits 131 and 132 in this embodiment, the arrangement of the CDS circuits 131 and 132 may be freely changed. The CDS circuits 131 and 132 can be arbitrarily arranged.

When a plurality of CDS circuits are arranged in sequence from the pixel array area 11 side along the wiring direction of the vertical signal line 29, the vertical signal line 29 is wired so as to extend toward the CDS circuit farthest from the pixel array area 11 (the CDS circuit 132 in this embodiment). Since such wiring makes the distance between the second capacitor 35 in the CDS circuit 131 and the vertical signal line 29 approximately equal to the distance between the second capacitor 38 in the CDS circuit 132 and the vertical signal line 29, a parasitic capacitance generated between the second capacitors 35 and 38 and the vertical signal line 29 has an equal effect on the electric charges stored in the second capacitors 35 and 38. As a result, the same CDS process can be performed in the CDS circuits 131 and 132.

Although both the first capacitor 31 for determining the difference between the signal voltage Vsig and the reset voltage Vrst and the clamp transistor 32 for clamping the voltage at the node N1 to a predetermined clamp voltage Vclp are shared between the CDS circuits 131 and 132 in the above embodiment, it is possible not to share the clamp transistor 32 and to share only the first capacitor 31 between the CDS circuits 131 and 132. Even when only the first capacitor 31 is shared between the CDS circuits 131 and 132, a large capacitor must be used in order to improve the effect of noise reduction, so that the decrease in the number of capacitors has a significant effect on downsizing of the semiconductor chip 10.

Figure 6:
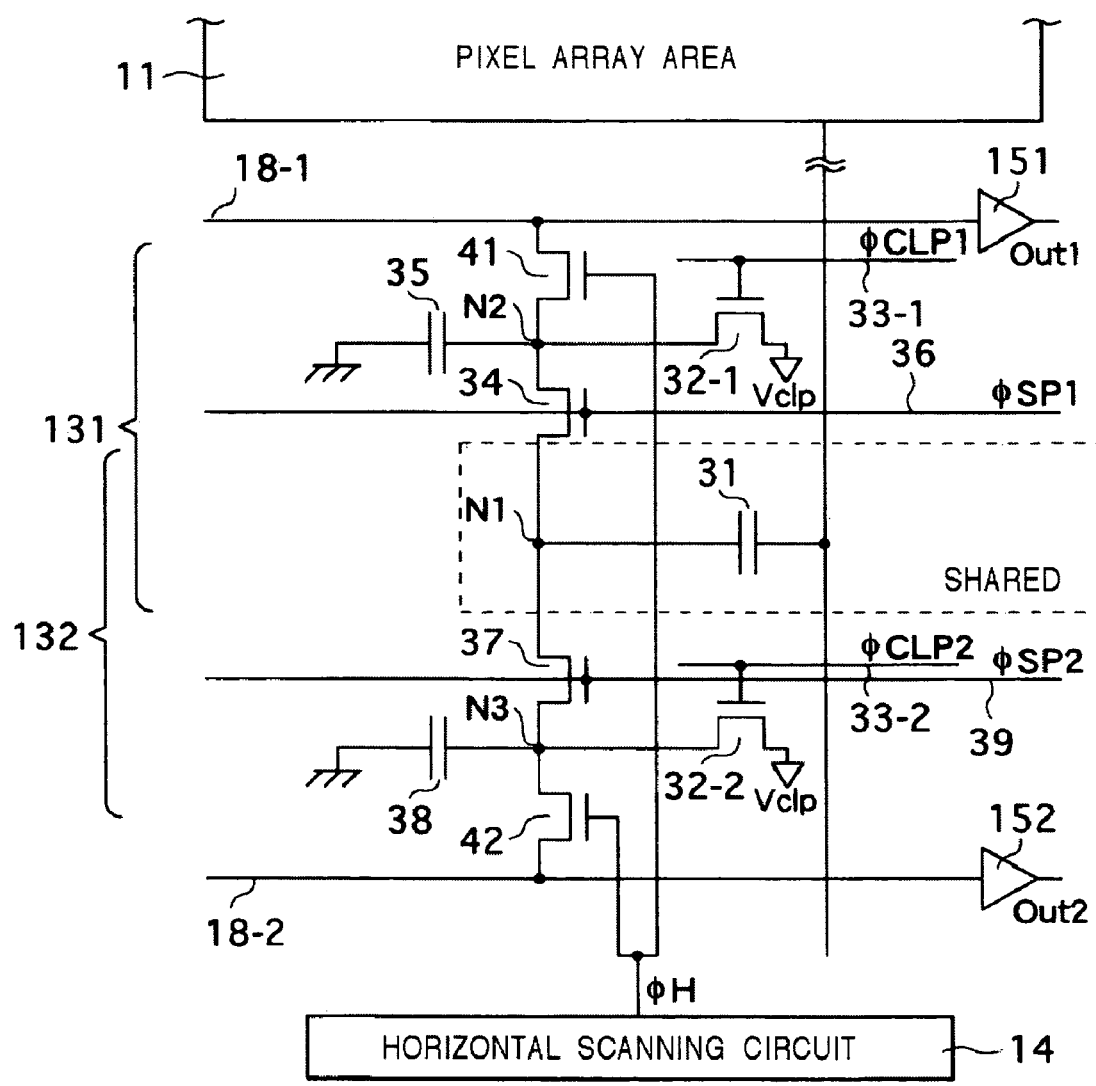
FIG. 6 is a circuit diagram showing a modification of the specific configuration of the two CDS circuits.
Figure 7:
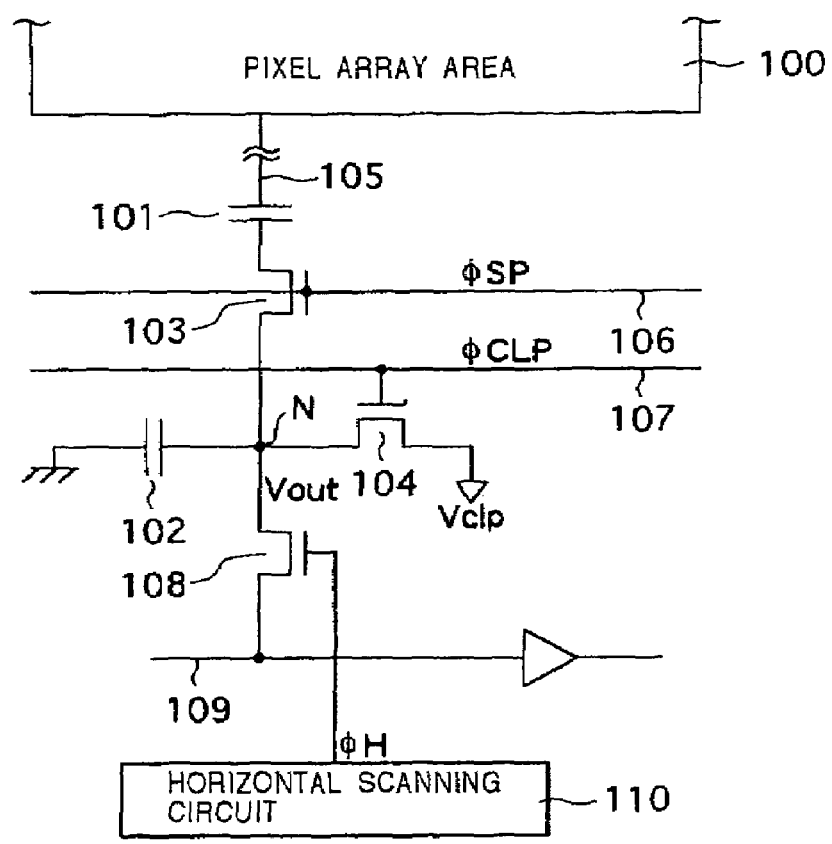
FIG. 7 is a circuit diagram showing a basic configuration of a CDS circuit.

FIG. 6 illustrates a configuration in which the clamp transistor 32 is not shared and only the first capacitor 31 is shared between the CDS circuits 131 and 132. The CDS circuit 131 in FIG. 6 has a configuration in which the source of a clamp transistor 32-1 is connected to the node N2 and the gate thereof is connected to a control line 33-1. A clamp voltage Vclp is applied to the drain of the clamp transistor 32-1. The CDS circuit 132 in FIG. 6 has a configuration in which the source of a clamp transistor 32-2 is connected to the node N3 and the gate thereof is connected to a control line 33-2. The clamp voltage Vclp is applied to the drain of the clamp transistor 32-2. At this time, the clamp pulses φCLP1 and φCLP2 are applied to the gates of the clamp transistors 32-1 and 32-2, respectively, at different timings.

Although the present invention is applied to the CMOS image sensor for exemplification in the embodiments described above, the present invention is not limited to the application to the CMOS image sensor. The present invention can be applied to an X-Y addressing solid-state imaging device. Furthermore, the present invention can be applied to a solid-state imaging device having a structure in which signal charges photoelectrically converted in pixels are vertically transferred by a vertical transfer unit provided for every vertical pixel column, the transferred signal charges are converted into electrical signals by an electrical charge detecting unit provided downstream of the vertical transfer unit for every vertical pixel column, and the converted electrical signals are output through the horizontal scanning.

The solid-state imaging device according to the present invention is used as an imaging device in a camera module, such as a digital still camera or a video camera, and is furthermore used as an imaging device in a mobile terminal typified by a mobile telephone having a camera function. It will be further understood by those skilled in the art that the foregoing description is of the preferred embodiments of the present invention and that various changes and modifications may be made to the invention without departing from the spirit and scope thereof.

What is claimed is:

1. A solid-state imaging device comprising:
   a pixel array area having pixels including photoelectric transducers arranged in column and row directions;
   a vertical signal line wired for each pixel column in the pixel array area and extending in the column direction; and
   a plurality of correlated double sampling (CDS) circuits provided for each corresponding vertical signal line, each CDS circuit independently sampling a reset level and a signal level of a pixel from said array during a single horizontal blanking interval,
   wherein each one of the plurality of the CDS circuits comprises:
      a first capacitor, one end of which is connected to the vertical signal line;
      a first switch element, a first port of which is connected to the other end of the first capacitor;
      a second capacitor connected between a second port of the first switch element and a reference voltage; and
      a clamping element for clamping a voltage of a connecting node between the first port of the first switch element and the first capacitor to a predetermined voltage, and
   wherein said first capacitor is shared amongst each one of the respective plurality of CDS circuits provided for each vertical signal line.

2. The solid-state imaging device according to claim 1, wherein the clamping clement is shared among the plurality of CDS circuits.

3. The solid-state imaging device according to claim 1, wherein the plurality of CDS circuits provided for each vertical signal line are arranged in the column direction, and
   wherein the corresponding vertical signal line extends across an output signal line of the CDS circuit farthest from the pixel array area.

4. A solid-state imaging device comprising:
   a pixel array area having pixels including photoelectric transducers arranged in column and row directions;
   a vertical signal line wired for each pixel column in the pixel array area and extending in the column direction;
   a first correlated double sampling (CDS) circuit connected to a corresponding vertical signal line for sampling a reset level and signal level of a first pixel from a first row of pixels from said array during a single horizontal blanking interval, said first correlated double sampling circuit comprised of:
      a first capacitor, one end of which is connected to the corresponding vertical signal line;
      a first switch element, a first port of which is connected to the other end of the first capacitor;
      a second capacitor connected between a second port of the first switch element and a reference voltage;
      a first output element, connected to the second port of the first switch element, for outputting a noise-reduced signal corresponding to said first pixel supplied from the array of pixels; and
   a second correlated double sampling (CDS) circuit also connected to said corresponding vertical signal line for sampling a reset level and signal level of a second pixel from a second row of pixels from said array during said same single horizontal blanking interval, said second correlated double sampling circuit comprised of:
      said first capacitor, one end of which is connected to said corresponding vertical signal line;
      a second switch element, a first port of which is connected to said other end of the first capacitor;
      a third capacitor connected between a second port of the second switch element and a reference voltage; and
      a second output element, connected to the second port of the second switch element, for outputting a noise-reduced signal corresponding to said second pixel supplied from the array of pixels; and
   a clamping element for clamping a voltage of a connecting node between said other end of the first capacitor and the first ports of the first and second switch elements to a predetermined voltage.

5. A solid-state imaging device comprising:
   a pixel array area having pixels including photoelectric transducers arranged in column and row directions;
   a vertical signal line wired for each pixel column in the pixel array area and extending in the column direction;
   a first correlated double sampling (ODS) circuit connected to a corresponding vertical signal line for sampling a reset level and signal level of a first pixel from a first row of pixels from said array during a single horizontal blanking interval, said first correlated double sampling circuit comprised of:
      a first capacitor, one end of which is connected to the corresponding vertical signal line;
      a first switch element, a first port of which is connected to the other end of the first capacitor;
      a second capacitor connected between a second port of the first switch element and a reference voltage;
      a first clamping element for clamping a voltage of a connecting node between the second port of the first switch element and the second capacitor to a predetermined voltage;
      a first output element, connected to the second port of the first switch element, for outputting a noise-reduced signal corresponding to said first pixel supplied from the array of pixels; and
   a second correlated double sampling (CDS) circuit also connected to said corresponding vertical signal line for sampling a reset level and signal level of a second pixel from a second row of pixels from said array during said same single horizontal blanking interval, said second correlated double sampling circuit comprised of:
      said first capacitor, one end of which is connected to said corresponding vertical signal line;
      a second switch element, a first port of which is connected to said other end of the first capacitor;
      a third capacitor connected between a second port of the second switch element and a reference voltage; and
      a second clamping element for clamping a voltage of a connecting node between the second port of the second switch element and the third capacitor to a predetermined voltage; and
      a second output element, connected to the second port of the second switch element, for outputting a noise-reduced signal corresponding to said second pixel supplied from the array of pixels.

6. The solid-state imaging device according to claim 4,
wherein the first and second CDS circuits provided for said corresponding vertical signal line are arranged in the column direction, and
wherein the corresponding vertical signal line extends across an output signal line of the CDS circuit farthest from the pixel array area.

7. The solid-state imaging device according to claim 5,
wherein the first and second CDS circuits provided for said corresponding vertical signal line are arranged in the column direction, and
wherein the corresponding vertical signal line extends across an output signal line of the CDS circuit farthest from the pixel array area.

8. The solid-state imaging device according to claim 4,
wherein said first row of pixels is the same row as said second row of pixels.

9. The solid-state imaging device according to claim 4,
wherein said first row of pixels is a different row than said second row of pixels.

10. The solid-state imaging device according to claim 5,
wherein said first row of pixels is the same row as said second row of pixels.

11. The solid-state imaging device according to claim 5,
wherein said first row of pixels is a different row than said second row of pixels.

* * * * *